(12) United States Patent
Xia et al.

(10) Patent No.: US 10,886,881 B2
(45) Date of Patent: Jan. 5, 2021

(54) MULTILEVEL CLASS-D POWER STAGE INCLUDING A CAPACITIVE CHARGE PUMP

(71) Applicant: TEXAS INSTRUMENTS INCORPORATED, Dallas, TX (US)

(72) Inventors: Yinglai Xia, Plano, TX (US); Shailendra Kumar Baranwal, Murphy, TX (US); Junmin Jiang, San Jose, CA (US); Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/360,703

(22) Filed: Mar. 21, 2019

(65) Prior Publication Data
US 2020/0304080 A1    Sep. 24, 2020

(51) Int. Cl.
*H03F 3/45*     (2006.01)
*H03F 3/217*    (2006.01)
*H02M 3/07*     (2006.01)

(52) U.S. Cl.
CPC ............. *H03F 3/217* (2013.01); *H02M 3/07* (2013.01); *H03F 2200/03* (2013.01)

(58) Field of Classification Search
CPC ........................................................ H03F 3/45

USPC ...................................... 330/251, 207 A, 261
See application file for complete search history.

(56) References Cited

U.S. PATENT DOCUMENTS

| | | | | |
|---|---|---|---|---|
| 5,994,960 A | * | 11/1999 | Baschirotto | ............. H03F 1/086 330/253 |
| 7,078,971 B2 | * | 7/2006 | Colbeck | ............. H03F 3/45192 330/255 |
| 7,589,587 B2 | * | 9/2009 | Yoshida | .................. H03F 3/387 330/258 |

* cited by examiner

*Primary Examiner* — Henry Choe
(74) *Attorney, Agent, or Firm* — Michael A. Davis, Jr.; Charles A. Brill; Frank D. Cimino

(57) ABSTRACT

An amplifier comprises eight transistors: the first coupled to a linked node and to a positive output node, the second coupled to the linked node and to a negative output node, the third coupled to the positive output node and a common potential, the fourth coupled to the negative output node and the common potential, the fifth coupled to a battery node, the sixth coupled to the fifth transistor and to the positive output node, the seventh coupled to the battery node, and the eighth coupled to the seventh transistor and to the negative output node. The amplifier also includes a charge pump to convert the battery voltage to an increased voltage on the linked node. The charge pump includes capacitors and operates at a lower frequency in lower power mode and a higher frequency in higher power mode to increase power provided to the linked node.

24 Claims, 9 Drawing Sheets

MULTILEVEL CLASS-D POWER STAGE INCLUDING A CAPACITIVE CHARGE PUMP

BACKGROUND

In some amplifier applications, a "class-D" amplifier architecture is used. For example, a class-D amplifier may be used in battery-powered audio applications. In some such systems, a multi-level class-D amplifier coupled to a charge pump, which increases a voltage from a power supply and may be used to deliver higher power to a load (e.g., a speaker). In a multi-level class-D amplifier, the pulse width modulated output may switch between three voltage levels. The three voltage levels may be ground, a battery voltage, and a linked voltage from the charge pump. Some class-D amplifier circuits may include control logic to operate the charge pump at different frequencies and increase the power available to the load.

SUMMARY

An amplifier comprises eight transistors: the first coupled to a linked node and to a positive output node, the second coupled to the linked node and to a negative output node, the third coupled to the positive output node and a common potential, the fourth coupled to the negative output node and the common potential, the fifth coupled to a voltage source node, the sixth coupled to the fifth transistor and to the positive output node, the seventh coupled to the voltage source node, and the eighth coupled to the seventh transistor and to the negative output node. In some examples, the amplifier also includes a charge pump configured to convert the voltage on the voltage source node to an increased voltage on the linked node. The charge pump includes capacitors and is configured to operate at a first, lower frequency for a first, lower power mode of operation and at a second, higher frequency for a second, higher power mode of operation.

The amplifier includes a controller configured to generate control signals for the eight transistors. In response to input signals to be amplified being within a first voltage range, the controller operates the amplifier in a lower power mode of operation, and toggles the voltage on one of the positive and negative output nodes between a common potential and the voltage on the power source node, while holding the other output node at the common potential. In the lower power mode of operation, the first and second transistors are in the off state, and the fifth and seventh transistors are in an on state.

While the positive input signal is in a positive half cycle and the negative input signal is in a negative half cycle, the controller keeps the fourth transistor in an on state and the eighth transistor in an off state, keeping the voltage on the negative output node at the common potential, and reciprocally toggles on and off the third and sixth transistors, switching the voltage on the positive output node between the common potential and the power source voltage. While the positive input signal is in a negative half cycle and the negative input signal is in a positive half cycle, the controller keeps the third transistor in an on state and the sixth transistor in an off state, keeping the voltage on the positive output node at the common potential, and reciprocally toggles on and off the eighth and fourth transistors, switching the voltage on the negative output node between the common potential and the power source voltage.

While input signals to be amplified are outside the first voltage range, the controller operates the amplifier in a higher power mode of operation, and toggles the voltage on one of the positive and negative output nodes between the voltage on the power source node and the increased voltage on the linked node from the charge pump while holding the other output node at the common potential. While the positive input signal is in a positive half cycle and the negative input signal is in a negative half cycle, the controller keeps the fourth and seventh transistors in an on state and the second and eighth transistors in an off state, keeping the voltage on the negative output node at the common potential. The controller keeps the sixth transistor in an on state and the third transistor in an off state, and reciprocally toggles on and off the first and fifth transistors, switching the voltage on the positive output node between the power source voltage and the increased voltage on the linked node from the charge pump.

While the positive input signal is in a negative half cycle and the negative input signal is in a positive half cycle, the controller keeps the third and fifth transistors in an on state and the first and sixth transistors in an off state, keeping the voltage on the positive output node at the common potential. The controller keeps the eighth transistor in an on state and the fourth transistor in an off state, and reciprocally toggles on and off the second and seventh transistors, switching the voltage on the negative output node between the power source voltage and the increased voltage on the linked node from the charge pump.

In some examples, the amplifier includes comparison logic to compare the positive and negative input signals to three ramp signals and determine whether the amplifier should operate in a lower or a higher power mode. Two of the ramp signals have the same peak-to-peak magnitude, which corresponds to the difference between the increased voltage from the charge pump and the power source voltage, but different common mode levels. The third ramp signal has a different peak-to-peak magnitude, which corresponds to the difference between the power source voltage and the common potential, and a different common mode level.

DETAILED DESCRIPTION

Figure 1:
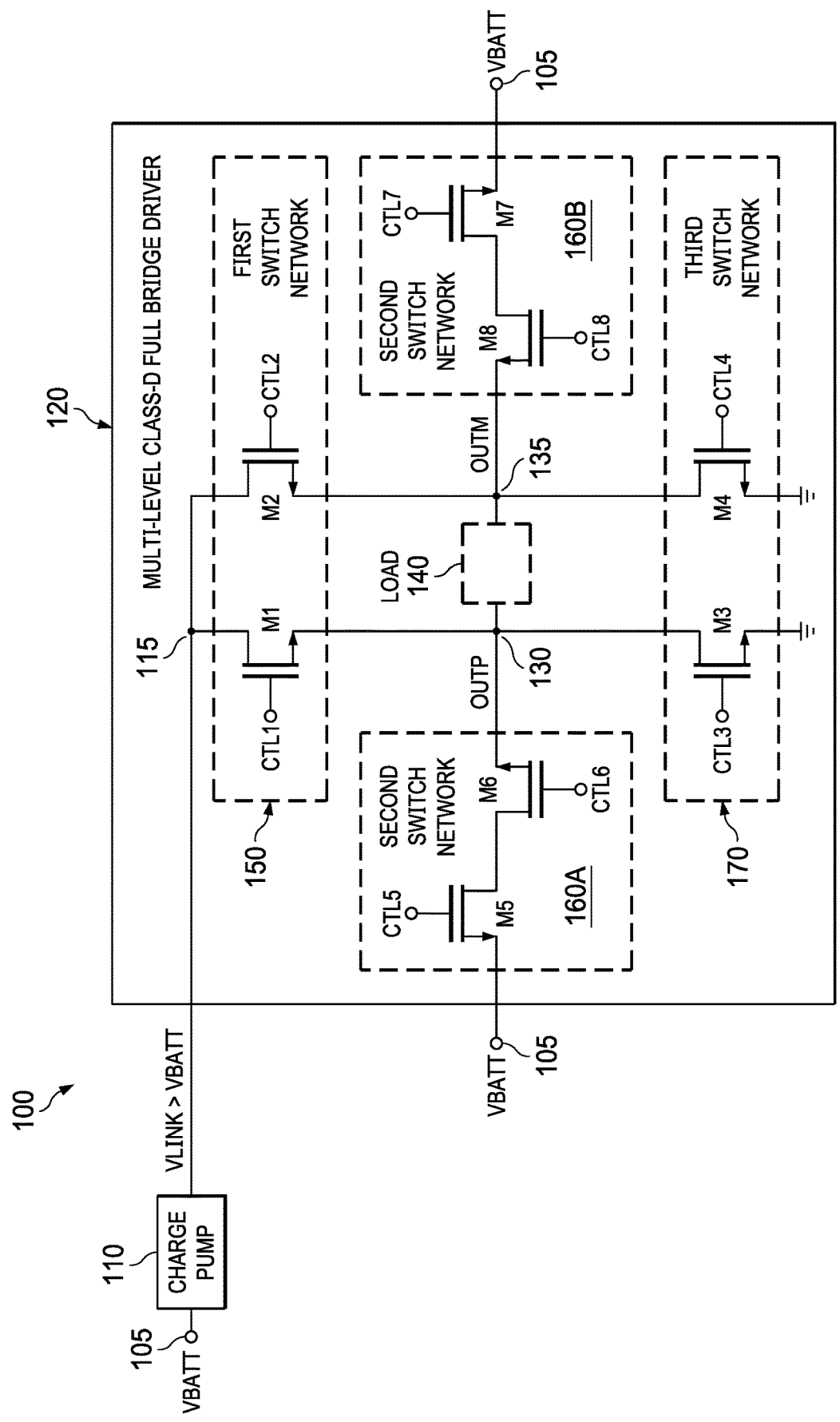
FIG. 1 illustrates an example output stage of an amplifier.

As described herein, an output stage of a class-D amplifier includes transistors coupled together in a configuration that permits the use of a charge pump for higher amplitude input signals to be amplified, and permits amplifier operation without the charge pump for lower amplitude input signals. In one example, the transistors include a first transistor coupled to a charge pump voltage source node and a positive output node of the amplifier. A second transistor couples to the charge pump voltage source node and a negative output node of the amplifier. A third transistor couples to the positive output node, and a fourth transistor couples to the negative output node. A fifth transistor is coupled to a source voltage node. A sixth transistor is coupled to the fifth transistor and the positive output node. A seventh transistor is coupled to the source voltage node. An eighth transistor is coupled to the seventh transistor and the negative output node.

A charge pump is also included as part of, or coupled to, the amplifier, and converts a source voltage (e.g., a battery voltage) of the source voltage node to a boosted voltage for the charge pump voltage source node. The charge pump voltage from the charge pump is greater than the source voltage. The charge pump uses capacitors to increase the voltage, avoiding the larger area, higher profile, and higher cost associated with inductor-based methods of boosting voltage. Responsive to a magnitude of an input signal to be amplified being within a particular voltage range (e.g., at the lower amplitude level using only the battery voltage, not the additional voltage from the charge pump), a controller coupled to or included within the amplifier generates control signals to keep the first and second transistors in an off state, disconnecting the charge pump from the positive and negative output nodes, and generates control signals to keep the fifth and seventh transistors in an on state.

During the positive half cycle of the positive input signal and the negative half cycle of the negative input signal, the controller generates control signals to keep the fourth transistor in an on state and the eighth transistor in an off state, causing the voltage on the negative output node to be a common level voltage. The controller also generates control signals to reciprocally toggle on and off the third and sixth transistors, causing the voltage on the positive output node to be either the battery voltage or the common level voltage.

During the negative half cycle of the positive input signal and the positive half cycle of the negative input signal, the controller generates control signals to keep the third transistor in an on state and the sixth transistor in an off state, causing the voltage on the positive output node to be the common level voltage. The controller also generates control signals to reciprocally toggle on and off the fourth and eighth transistors, causing the voltage on the negative output node to be either the battery voltage or the common level voltage.

Responsive to the magnitude of the input signal being outside the particular voltage range (e.g., at the higher amplitude requiring increased voltage from the charge pump) and during the positive half cycle of the positive input signal and the negative half cycle of the negative input signal, the controller generates control signals to keep the fourth and the seventh transistors in an on state and the second and the eighth transistors in an off state, causing the voltage on the negative output node to be the common level voltage. The controller also generates control signals to keep the sixth transistor in an on state, the third transistor in an off state, and reciprocally toggle the first and fifth transistors, causing the voltage on the positive output node to be either the boosted voltage from the charge pump or the battery voltage.

During the negative half cycle of the positive input cycle and the positive half cycle of the negative input signal, the controller generates control signals to keep the eighth transistor in an on state, the fourth transistor in an off state, and reciprocally toggle the second and seventh transistors, causing the voltage on the negative output node to be either the boosted voltage from the charge pump or the battery voltage. The controller also generates control signals to keep the third and fifth transistors in an on state and the first and sixth transistors in an off state, causing the voltage on the positive output node to be the common level voltage. Responsive to the duty cycle of the voltage output by the amplifier being less than a particular threshold, the controller generates control signals to operate the charge pump at a first frequency. Responsive to the duty cycle of the voltage output by the amplifier being greater than the particular threshold, the controller generates control signals to operate the charge pump at a second frequency which is greater than the first frequency.

FIG. 1 illustrates an example output stage 100 of an amplifier. Additional components may be included as part of the amplifier as well, at least some of which are illustrated in other figures and discussed below. In the example of FIG. 1, the output stage 100 includes a charge pump 110 and a multi-level class-D full bridge driver 120. The charge pump 110 is coupled to a voltage source node 105 and to a second node 115. The voltage source node 105 may be coupled to a voltage source (not shown), and thus the voltage on the voltage source node 105 may be the voltage of that particular voltage source. In one example, the voltage source is a battery, although the voltage source can be other than a battery in other examples. The voltage source node 105 is labeled as "VBATT" to illustrate the example in which the voltage source is a battery. The voltage source node 105 is referred to herein as the "VBATT node".

Node 115 is labeled as "VLINK" to illustrate voltage output by charge pump 110 linked to bridge driver 120. Node 115 is referred to herein as the "VLINK node". The charge pump 110 may be part of, or separate from, the amplifier's output stage 100. The charge pump 110 receives the voltage from the VBATT node 105 and generates an output voltage that is greater than the voltage on the VBATT node. The output voltage from the charge pump 110 is provided to the VLINK node 115. In this example, the charge pump 110 outputs a voltage that is three times the voltage at the VBATT node 105, but any appropriate increase in voltage may be used.

The bridge driver 120 in the example of FIG. 1 includes eight transistors shown as M1, M2, M3, M4, M5, M6, M7, and M8 arranged into three switch networks. The first switch network 150 includes M1 and M2. The drains of M1 and M2 connect to the VLINK node 115. The source of M1 is connected to a node 130, which represents the positive output node (OUTP) of the amplifier. The source of M2 is connected to a node 135, which represents the negative (minus) output node (OUTM) of the amplifier. Each of M1 and M2 is controlled by respective control signals shown in FIG. 1 as CTL1 (for M1) and CTL2 (for M2) applied to the respective gates of M1 and M2. The first switch network 150 connects a voltage at VLINK node 115 to the output nodes OUTP 130 and OUTM 135.

The third switch network 170 includes M3 and M4. The sources of M3 and M4 are connected to a common potential (e.g., ground). The drain of M3 is connected to OUTP node 130 and the drain of M4 is connected to OUTM node 135. M3 is controlled by control signal CTL3 applied to its gate. M4 is controlled by control signal CTL4 applied to its gate. The third switch network 170 connects a common potential to the output nodes OUTP 130 and OUTM 135.

The second switch network 160A includes M5 and M6 and the second switch network 160B includes M7 and M8. The sources of M5 and M7 connect to VBATT node 105. The drain of M5 connects to the drain of M6. The drain of M7 connects to the drain of M8. The source of M6 connects to OUTP node 130. The source of M8 connects to OUTM node 135. M5, M6, M7, and M8 are controlled by a respective control signal applied to the respective gates of the transistors. M5 is controlled by control signal CTL5, M6 is controlled by control signal CTL6, M7 is controlled by control signal CTL7, and M8 is controlled by control signal CTL8. The second switch network 160A connects a voltage at VBATT node 105 to OUTP node 130. The second switch network 160B connects a voltage at VBATT node 105 to OUTM node 135.

In some examples, at least one of the transistors M1-M8 is a laterally diffused metal oxide semiconductor field effect transistor (LDMOS). In some implementations, all of the transistors M1-M8 are LDMOS transistors. In the example of FIG. 1, transistors M1-M8 are n-type LDMOS transistors. The bulk (sometimes called "back gate") connection of each transistor may be connected to the source of the respective transistor. Switches and control logic to dynamically connect the bulk of each transistor to different potentials and nodes need not be included. The transistors M1-M8 are shown as metal oxide semiconductor field effect transistors, but can be implemented as other types of transistors, for example bipolar junction transistors.

In operation, the transistors M1-M8 of the output stage 100 provide voltage to OUTP node 130 and OUTM node 135, and by extension to a load 140 connected to them. Transistors M1-M8 are controlled in multiple different modes of operation depending on the magnitude of the input signal to be amplified. For example, a lower power mode of operation is used in response to the input signal being less than a threshold level and a higher power mode of operation is used in response to the input signal being greater than the threshold level. Each of these operational modes is explained below.

Figure 2:
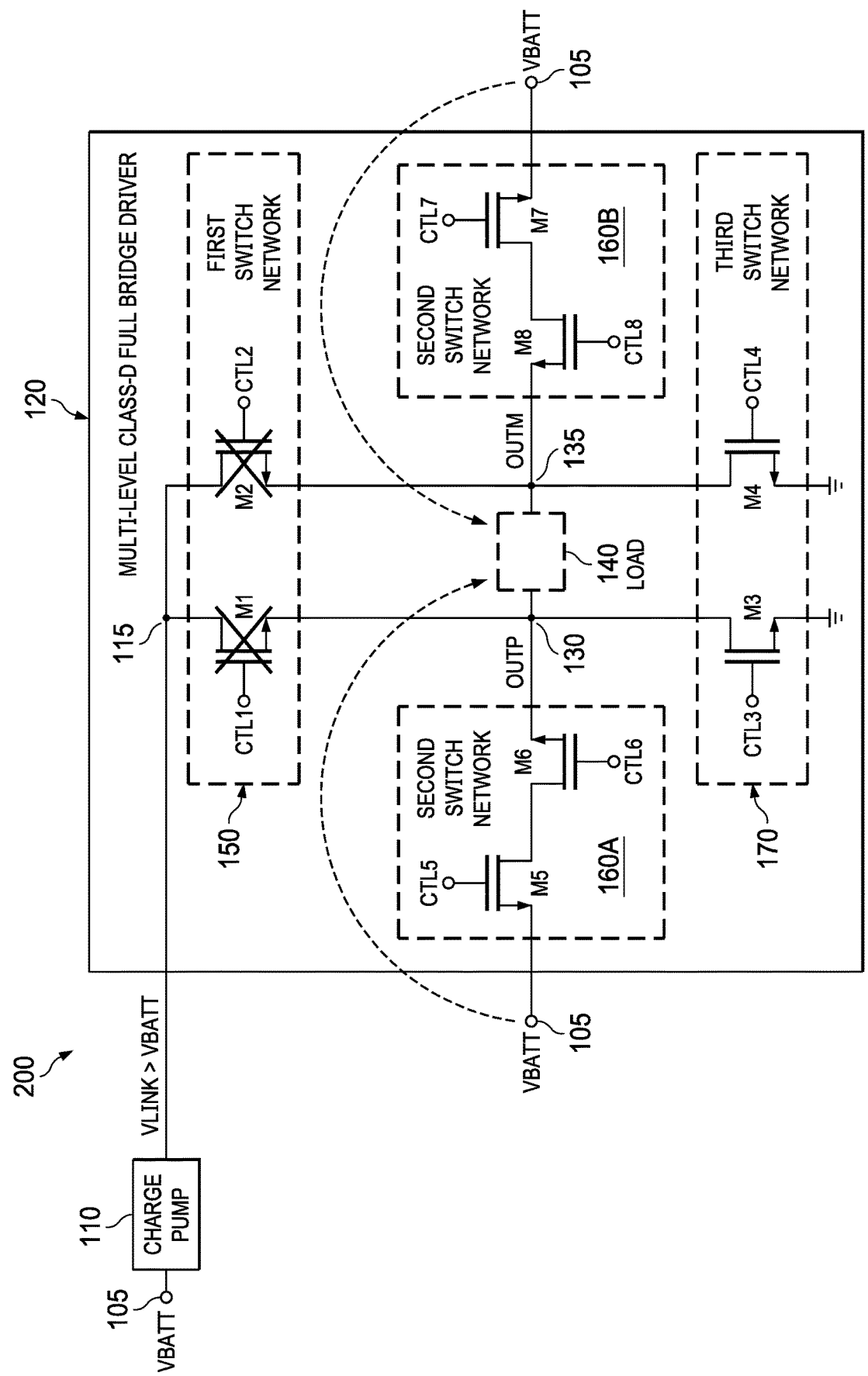
FIG. 2 illustrates an example of the operation of the example output stage of FIG. 1 for a lower power mode of operation.

FIG. 2 illustrates the lower power mode of operation. In this mode, the input signal is less than a threshold and the voltage from the battery is sufficient. The first switch network 150 disconnects the voltage at VLINK node 115 from output nodes OUTP 130 and OUTM 135. Control logic (shown in other figures) generates control signals CTL1 and CTL2 to maintain M1 and M2 in an off state, as indicated by the "X"s through M1 and M2. While M1 and M2 are in an off state, the voltage on VLINK node 115 remains the boosted voltage from the charge pump, which is available to the output nodes at any time. In response to the output amplification increase, M1 and M2 may immediately begin toggling to transfer the boosted voltage from the charge pump. While the output stage 100 operates in a lower power mode and the charge pump 110 is disconnected from bridge drive 120, charge pump 110 may operate in a lower power mode of operation at a lower frequency, for example 50 kiloHerz (kHz).

While the amplifier operates in the lower power mode of operation and M1 and M2 are kept in an off state, the control logic also generates control signals CTL5 and CTL7 to maintain M5 and M7 in an on state. As such, the VBATT voltage, and not VLINK, may be switched through M5 and M6 to OUTP node 130 and through M7 and M8 to OUTM node 135 as shown by the dashed arrows.

During the positive half cycle of the positive input signal and the negative half cycle of the negative input signal, the control logic generates control signals CTL4 and CTL8 to maintain M4 in an on state and M8 in an off state, causing the voltage on OUTM node 135 to be ground. The control logic also generates control signals CTL6 and CTL3 to reciprocally toggle M6 and M3 on and off, causing the voltage on OUTP node 130 to toggle between VBATT and ground as shown in sections 310 and 330 of FIG. 3.

Figure 3:
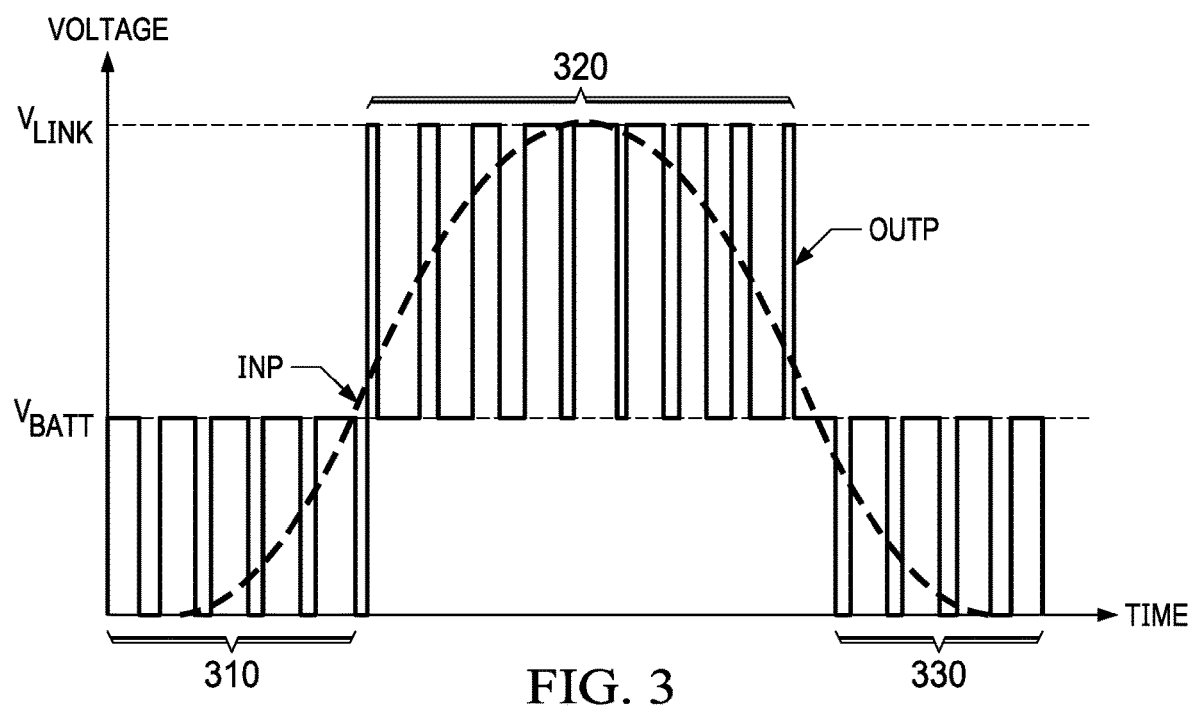
FIG. 3 shows a waveform of an example amplifier output node during both lower and higher power modes of operation, and a waveform of an example filtered input signal.

During the negative half cycle of the positive input signal and the positive half cycle of the negative input signal, not shown in FIG. 3, the controller generates control signals CTL3 and CTL6 to maintain M3 in an on state and M6 in an off state, causing the voltage on OUTP node 130 to be ground. The control logic also generates control signals CTL4 and CTL8 to reciprocally toggle M4 and M8 on and off, causing the voltage on OUTM node 15 to toggle between VBATT and ground.

Thus, the output of the amplifier comprises OUTP node 130 and OUTM node 135 and provides a differential output, which in the lower power mode of operation varies between +VBATT and −VBATT. Some implementations may include a current recycling phase, where both OUTM and OUTP are at the same voltage potential by having M3 and M4 (or M6 and M8) on at the same time. During this phase, current is recycled through the transistor switches in the on state.

FIG. 3 shows a waveform for OUTP 130 of output stage 100 in FIG. 1 during both lower and higher power modes of operation, and a waveform of the filtered input signal INP. In response to the INP signal being less than a threshold level, the lower power mode of operation is used as shown in sections 310 and 330. While the output stage 100 operates in a lower power mode, the charge pump 110 may be disconnected from bridge driver 120, and the OUTP voltage switches between the battery voltage at VBATT 105 and ground, as described herein with reference to FIG. 2. The OUTP waveform in section 320 illustrates the OUTP voltage in response to the magnitude of the INP signal being greater than the threshold. While the output stage 100 operates in a higher power mode, the charge pump 110 may provide the boosted voltage at VLINK node 115, and by extension deliver higher power to the load. In the higher power mode of operation, the voltage on VLINK node 115 switches between the increased voltage VLINK from the charge pump 110 and the battery voltage from VBATT 105.

Figure 4:
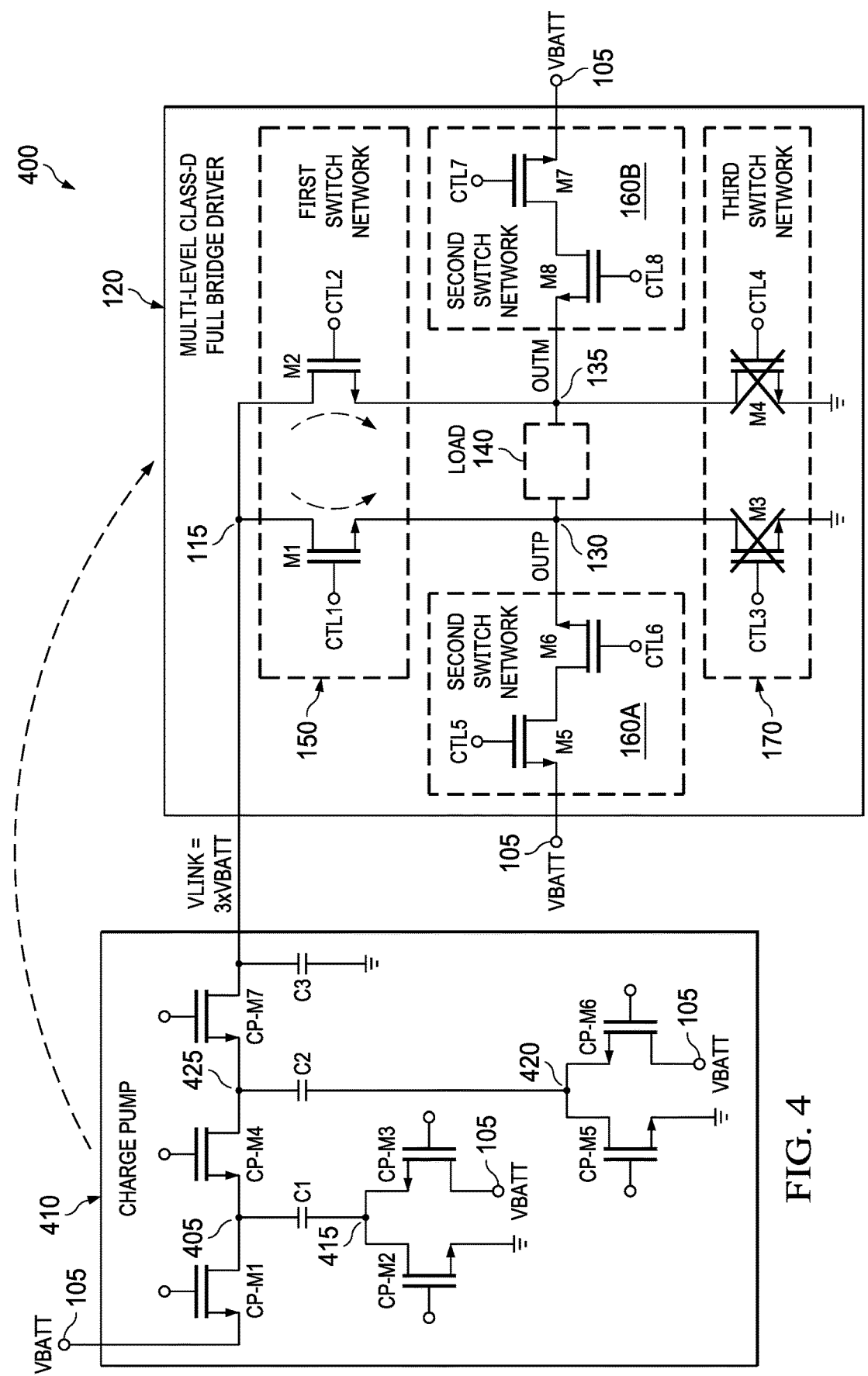
FIG. 4 shows an example output stage of an amplifier including a charge pump.

FIG. 4 shows an example output stage 400 of an amplifier including a charge pump 410. The output stage 400 is described herein with reference to FIG. 1 and includes a variable frequency charge pump 410 and a bridge driver 120. Charge pump 410 in the example of FIG. 4 includes seven transistors, shown as CP-M1, CP-M2, CP-M3, CP-M4, CP-M5, CP-M6 and CP-M7, where CP indicates charge pump. The source of CP-M1 connects to VBATT node 105 and the drain connects to node 405. A capacitor C1 connects to node 405 and node 415. The drain of CP-M2 and the source of CP-M3 connect to node 415. The source of CP-M2 connects to a common potential (e.g., ground). The drain of CP-M3 connects to VBATT node 105. CP-M1, CP-M2, and CP-M3 are controlled by respective control signals not shown in FIG. 4, which are applied to the respective transistors' gate terminals.

The source of CP-M4 connects to node 405, and the drain connects to node 425. A capacitor C2 connects to node 425 and node 420. The drain of CP-M5 and the source of CP-M6 connect to node 420. The source of CP-M5 connects to a common potential (e.g., ground). The drain of CP-M6 connects to VBATT node 105. CP-M4, CP-M5, and CP-M6 are controlled by respective control signals not shown in FIG. 4, which are applied to the respective transistors' gate terminals. The source of CP-M7 connects to node 425, and the drain connects to VLINK node 115. CP-M7 is controlled by a control signal not shown in FIG. 4 which is applied to the gate terminal. A capacitor C3 connects to VLINK node 115 and a common potential (e.g., ground).

In operation, during a first clock phase, CP-M1 and CP-M2 are maintained in an on state, and C1 is charged to approximately VBATT. CP-M3 and CP-M4 are maintained in an off state. During a second clock phase initiated after C1 is charged to approximately VBATT, CP-M3, CP-M4, and CP-M5 are maintained in an on state. C2 is charged to approximately two times VBATT while CP-M1, CP-M2, CP-M6, and CP-M7 are maintained in an off state. During a third clock phase initiated after C2 is charged to approximately two times VBATT, CP-M6 and CP-M7 are maintained in an on state, and C3 is charged to approximately three times VBATT. CP-M4 and CP-M5 are maintained in an off state. Thus, the voltage at VLINK node 115 is approximately three times VBATT. In this way, the charge pump 410 transfers power to VLINK node 115, and the power at VLINK node 115 is transferred through bridge driver 120 to load 140, as indicated by the dashed arrows.

The third clock phase may also be used to charge C1 at the same time. As discussed above, CP-M4 is maintained in an off state while C1 and C3 are charged. While CP-M6 and CP-M7 are maintained in an on state and CP-M4 and CP-M5 are maintained in an off state to charge C3, CP-M1 and CP-M2 may be maintained in an on state and CP-M3 maintained in an off state to charge C1. In this case, the first clock phase and the third clock phase are the same. While only three stages are shown here, any number of stages may be used to increase the voltage at VLINK node 115 to any appropriate level.

The use of capacitors causes the charge pump to be cheaper, lower profile, and smaller size than a similar inductor-based boost converter. As discussed above with reference to FIG. 2, the capacitors store charge such that the boosted voltage from the charge pump is available to the bridge driver 120 at any time. In contrast, inductor based boost converters cannot maintain the boosted voltage at VLINK node 115 and may experience a delay while the inductors charge, resulting in a slower increase in the voltage on VLINK node 115. Inductor based boost converters use a voltage regulator to control the voltage available to other circuits from the inductor based boost converter.

Inductor based boost converters may experience difficulties with stability as the inductors and capacitors oscillate. Further, design of controllers for inductor based boost converters may be difficult because they work in tandem with a voltage regulator to control the voltage output to VLINK node 115. In contrast, the capacitive charge pump 410 maintains a steadier voltage on VLINK node 115 at all times and is controlled in part by an open feedback loop associated with voltage on the output nodes, the same feedback loop used to inform control of bridge driver 120. This results in a single feedback circuit providing feedback to both the charge pump 410 and the bridge driver 120. The control complexity is thus lower than in some inductor based boost converters, which use two separate closed loop feedback circuits—one for the inductor based boost converter and another for the bridge driver. The chip area devoted to control of the capacitor based charge pump 410 is also smaller than in some inductor based boost converters and amplifiers.

While the output stage 400 operates at a higher power mode of operation, charge pump 410 provides the increased voltage to VLINK node 115. The first switch network 150 connects the voltage at VLINK node 115 to output nodes OUTP 130 and OUTM 135, while the third switch network 170 disconnects the common potential from output nodes OUTP 130 and OUTM 135.

During the positive half cycle of the positive input signal and the negative half cycle of the negative input signal, control logic (shown in other figures) generates control signals CTL4 and CTL7 to maintain M4 and M7 in an on state and control signals CTL2 and CTL8 to maintain M2 and M8 in an off state, causing the voltage on OUTM 135 to be the common potential. The control logic also generates control signal CTL6 to maintain M6 in an on state and control signal CTL3 to maintain M3 in an off state, disconnecting the common potential from OUTP 130 as indicated by the "X" through M3. The control logic generates control signals CTL1 and CTL5 to reciprocally toggle M1 and M5 on and off, causing the voltage on OUTP 130 to switch between VLINK and VBATT.

During the negative half cycle of the positive input signal and the positive half cycle of the negative input signal, the control logic generates control signal CTL8 to maintain M8 in an on state and control signal CTL4 to maintain M4 in an off state, disconnecting the common potential from OUTM 135 as indicated by the "X" through M4. The control logic also generates control signals CTL2 and CTL7 to reciprocally toggle M2 and M7 on and off, causing the voltage on OUTM 135 to switch between VLINK and VBATT. The control logic also generates control signals CTL3 and CTL5 to maintain M3 and M5 in an on state and control signals CTL1 and CTL6 to maintain M1 and M6 in an off state, causing the voltage on OUTP 130 to be the common potential.

Because M1 and M5 are reciprocally turned on and off, the voltage on OUTP node 130 may toggle between VLINK and VBATT as shown in section 320 of FIG. 3. Because M2 and M7 are reciprocally turned on and off, the voltage on OUTM node 135 may toggle between VLINK and VBATT. Thus, the output node of the amplifier comprises OUTP node 130 and OUTM node 135 and provides a differential output, varying between +VLINK and −VLINK. The state of M6 and M8 need not be on or off for bridge driver 120 to output voltage between +VLINK and −VLINK. In some implementations, M6 and M8 are maintained in an on state for ease of control.

In some examples, the charge pump 410 operates at variable frequencies according to the power used by the amplifier. While the magnitude of the INP signal is greater than the threshold, the output stage 400 operates in a higher power mode, and charge pump 410 provides the boosted voltage through VLINK node 115. While output stage 400 operates in the higher power mode, the charge pump 410 may operate at a mid-level power mode or a higher power mode of operation. At the mid-level power mode, the charge pump 410 operates at a lower frequency than it does in its higher power mode of operation. For example, the charge pump 410 illustrated in FIG. 4 operates at 760 kiloHerz (kHz) in the mid-level power mode, but operates at 1.52 MHz in the higher power mode. The lower frequency and the higher frequency may be selected based on the FET driving losses within the charge pump and the capacitance of C1, C2, and C3.

The mid-level power mode or higher power mode of operation of charge pump 410 is selected based on the duty cycle of the amplifier output. For example, control logic indicates charge pump 410 operates in mid-level power mode based on the pulse width modulation signal at VLINK node 115 having a duty cycle less than a threshold value. In the example of FIG. 4, the charge pump 410 operates in mid-level power mode based on the pulse width modulation signal at VLINK node 115 having a duty cycle less than 50%. Control logic indicates charge pump 410 operates in higher power mode based on the pulse width modulation signal at VLINK node 115 having a duty cycle greater than a threshold value. In the example of FIG. 4, the charge pump 410 operates in higher power mode in response to the pulse width modulation signal at VLINK node 115 having a duty cycle greater than 50%.

Figure 5:
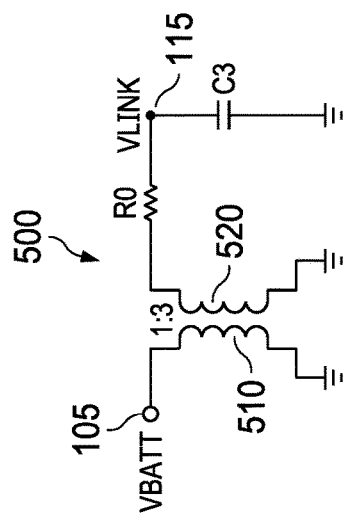
FIG. 5 shows a model of an example higher power mode of operation of the charge pump in the example output stage of FIG. 4.

FIG. 5 is a model of the charge pump 410 in the example output stage 400 of FIG. 4. As it operates at higher frequencies, the output impedance of the charge pump 410 decreases, and the current output deliverable by charge pump 410 increases. The charge pump 410 effectively operates as a step-up transformer coupled to VBATT node 105 and resistor R0. R0 represents the output impedance of the charge pump 410 and is further coupled to VLINK node 115. Capacitor C3 is coupled between VLINK node 115 and a common potential (e.g., ground). The transformer comprises a primary winding 510 and a secondary winding 520, where the ratio of the number of turns in the primary winding, Np, to the number of turns in the secondary winding, Ns, in this example is 1:3. This illustrates that charge pump 410 continues to provide approximately three times the voltage of VBATT to VLINK node 115. As the frequency increases, the output impedance R0 decreases and the voltage at VLINK node 115 approaches VLINK.

Figure 6:
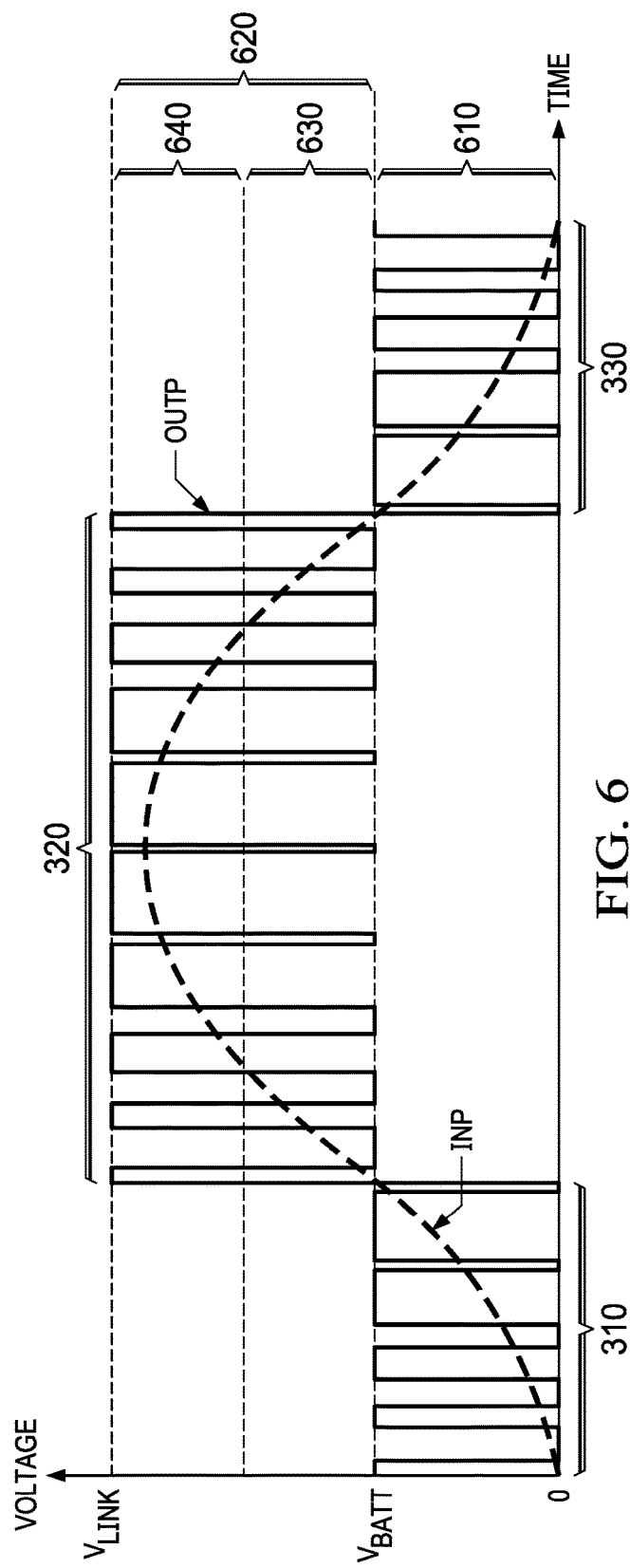
FIG. 6 shows a waveform of an example amplifier output node during lower, mid-level, and higher power modes of operation characteristic of the example output stage of FIG. 4, and a waveform of an example filtered input signal.

FIG. 6 shows a waveform OUTP 130 of output stage 400 in FIG. 4 during lower and higher power modes of operation characteristic of output stage 400, and a waveform of the filtered input signal INP. As shown in and described with reference to FIG. 3, in response to the INP signal being less than a threshold level such as VBATT in this example, the lower power mode of operation 610 for output stage 400 is used and illustrated as sections 310 and 330. While the output stage 400 operates in lower power mode 610, the charge pump 410 may be disconnected from bridge driver 120 and operate in a lower power mode at a lower frequency, such as 50 kHz as discussed above with reference to FIG. 2, while maintaining the boosted voltage at VLINK node 115. The OUTP voltage results from the battery voltage at VBATT 105 alone, as described herein with reference to FIG. 2.

The OUTP waveform in section 320 illustrates the OUTP voltage in response to the magnitude of the INP signal being greater than the threshold, VBATT in this example. While the output stage 400 operates in a higher power mode 620, the charge pump 410 may provide the boosted voltage at VLINK node 115. The charge pump 410 operates in a mid-level power mode 630 and a higher power mode 640, as described herein with reference to FIGS. 4 and 5. In mid-level power mode 630, the example charge pump 410 operates at a lower frequency, such as 760 kHz. In higher power mode 640, the example charge pump 410 operates at a higher frequency, such as 1.52 MHz. As described herein with reference to FIG. 4, the charge pump 410 operates in mid-level power mode 630 in response to the pulse width modulation signal at VLINK node 115 having a duty cycle less than 50% and operates in higher power mode 640 in response to the signal having a duty cycle greater than 50%.

The different frequencies of operation allow charge pump 410 to dynamically respond to the changing power used by output stage 400 based on the desired amplification of the input signal. While output stage 400 operates in a lower power mode of operation, charge pump 410 operates at a lower power mode as well, at a lower frequency such as 50 kHz. The capacitors within charge pump 410 maintain the boosted VLINK voltage on VLINK node 115 while charge pump 410 operates at a lower power mode. While output stage 400 operates in a higher power mode, charge pump 410 operates in either a mid-level power mode or a higher power mode at the corresponding frequencies, increasing the power available to the output nodes based on the desired amplification of the input signal.

Figure 7:
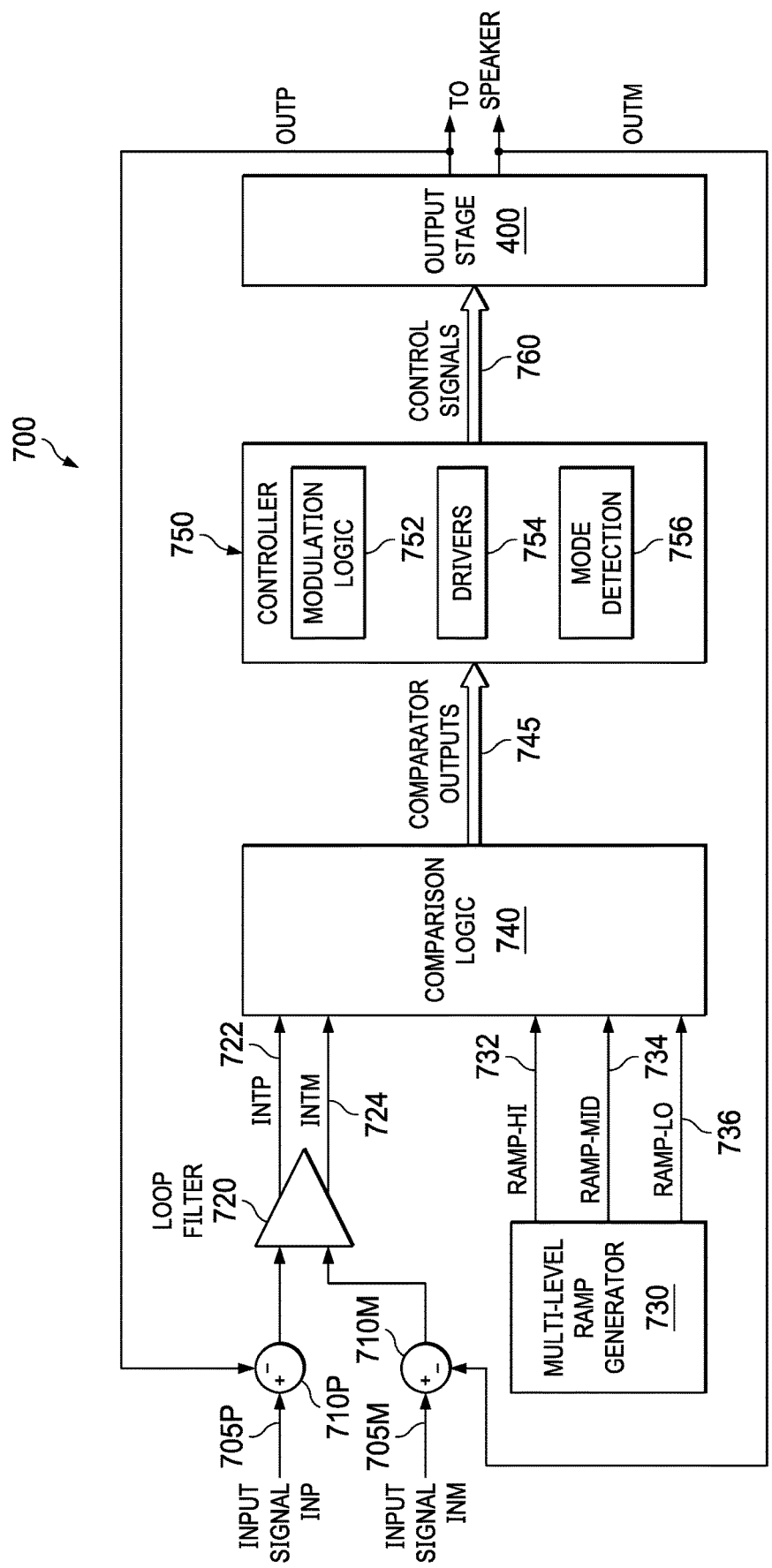
FIG. 7 shows an example amplifier including the example output stage of FIG. 4 and an example multi-level ramp generator.

FIG. 7 shows an example amplifier 700 including the output stage 400 described herein with reference to FIG. 4 and a multi-level ramp generator 730. The amplifier 700 in this example also includes a subtractor 710P, a subtractor 710M, a loop filter 720, comparison logic 740, and controller 750. An input signal 705 to be amplified includes two signals: INP 705P and INM 705M. INP 705P represents the positive input signal, and INM 705M represents the negative (minus) input signal. INP 705P is provided to the subtractor 710P, and INM 705M is provided to the subtractor 710M.

The difference signal from each subtractor is then filtered by loop filter 720, which may comprise a fourth-order filter, to generate two filtered input signals, INTP 722 and INTM 724. Loop filter 720 compensates for non-linear factors in example amplifier 700, for example dead time. INTP 722 corresponds to INP 705P and has a similar shape as INP 705P. INTM 724 corresponds to INM 705M and has a similar shape as INM 705M. Multi-level ramp generator 730 generates three triangular voltage waveforms: RAMP_HI 732, RAMP_MID 734, and RAMP_LO 736. The three RAMP signals are compared to INTP 722 and INTM 724 by comparison logic 740 to generate pulse width modulated signals, which are the comparator outputs 745 provided to the controller 750.

The control logic noted above may include the controller 750 and/or other components shown in FIG. 7. The controller 750 includes modulation logic 752, drivers 754, and mode detection 756. Modulation logic 752 and drivers 754 generate the control signals CTL1-CTL8 discussed herein with reference to FIG. 1 that are provided to the gates of M1-M8 in the output stage 100. Mode detection 756 generates the control signals provided to the gates of CP-M1 through CP-M7 in charge pump 410 discussed herein with reference to FIG. 4. The assorted control signals 760 generated by controller 750 are provided to output stage 400. The output signal generated by the output stage 400 (e.g., the voltages on OUTP 130 and OUTM 135) is provided to the speaker and also serves as a feedback signal to the subtractors 710.

Figure 8:
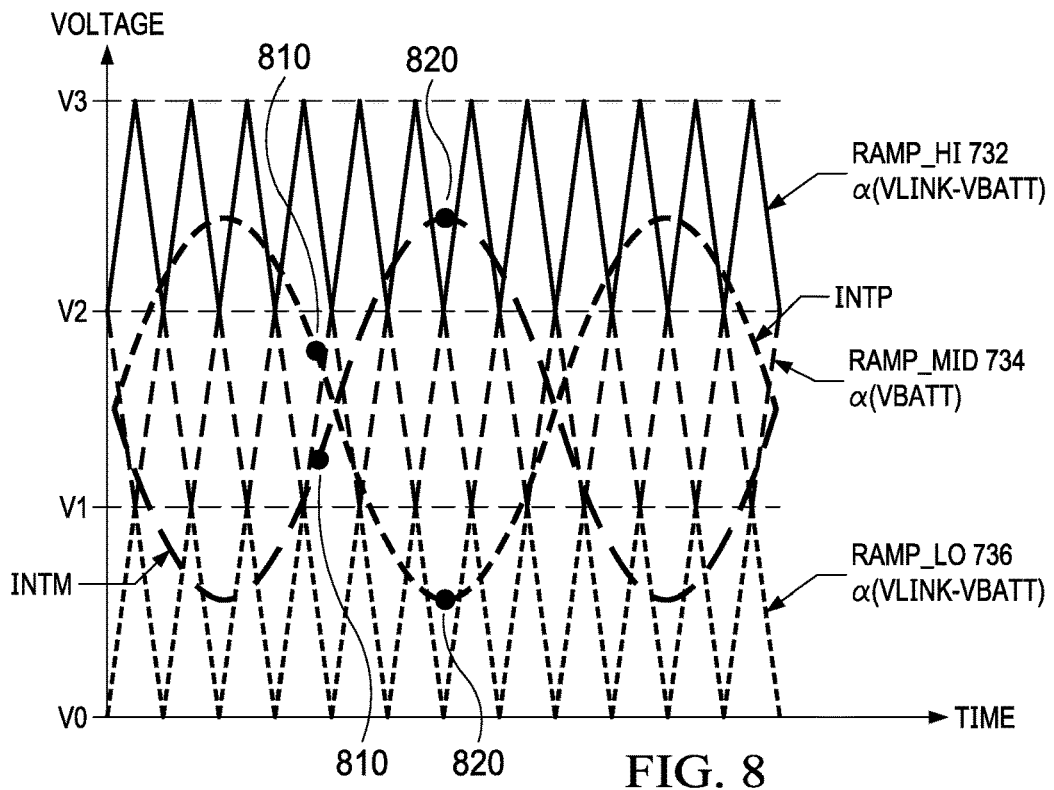
FIG. 8 shows waveforms characteristic of the example amplifier of FIG. 7.

FIG. 8 illustrates an example of the three triangular voltage waveforms generated by multi-level ramp generator 730, and an example INTP 722 waveform and INTM 724 waveform. RAMP_HI 732 has a minimum voltage of V2 and a maximum voltage of V3. RAMP_MID 734 has a minimum voltage of V1 and a maximum voltage of V2. RAMP_LO 736 has a minimum voltage of V0 and a maximum voltage of V1. The voltage difference between V3 and V2, the voltage difference between V2 and V1, and the voltage difference between V1 and V0 (referred to as the peak-to-peak voltage for the ramps) may be selected such that the overall relationship from the input to the comparators to the output of the final output stage maintains a substantially constant gain. For example, the peak-to-peak voltages for RAMP_HI 732 and RAMP_LO 736 are chosen to have the same ratio as the difference between VLINK and VBATT. The peak-to-peak voltage for RAMP_MID 734 is chosen to have the same ratio as the difference between VBATT and ground. RAMP_HI 732, RAMP_MID 734, and RAMP_LO 736 may have different peak-to-peak magnitudes and different common mode levels as shown. The use of three ramp signals, each with different common mode levels, may capture information related to the negative parts of INTP 722 and INTM 724 that would be outside the voltage range covered by only two ramp signals. This may reduce common mode error and the total harmonic distortion of the amplifier.

A portion of the signals output by the loop filter 720, INTP 722 and INTM 724, are shown superimposed on the sawtooth waveforms of RAMP_HI 732, RAMP_MID 734, and RAMP_LO 736. Voltages V2 and V1, the range of RAMP_MID 734, generally represent the threshold voltages for determining whether the controller 750 is to operate the output stage 400 in the lower power mode of operation 610 or the higher power mode of operation 620 noted above. While the magnitudes of INTP 722 and INTM 724 are less than V2 but greater than V1, for example as identified at 810, the output 745 of comparison logic 740 includes a time varying square wave with a first duty cycle, which corresponds to the pulse width modulation signal associated with the voltage VBATT. While the magnitudes of INTP 722 and INTM 724 are greater than V2 or less than V1, for example as identified at 820, the output 745 of comparison logic 740 includes a time varying square wave with a second duty cycle, which corresponds to the pulse width modulation signal associated with voltage VLINK.

The controller 750 uses the output signals 745 from the comparison logic 740 of varying duty cycles to determine whether the output stage 400 should be operated in the lower power mode of operation 610 without use of the voltage from the charge pump 410 or in the higher power mode of operation 620 to use the voltage from charge pump 410. If the controller 750 determines the output stage 400 should be operated in the higher power mode of operation 620, the controller 750 further determines whether the charge pump 410 should be operated in the mid-level power mode of operation 630 at the lower frequency or in the higher power mode of operation 640 at the higher frequency based on the duty cycles of the output signals 745 from the comparison logic 740. The controller 750 and comparison logic 740 are discussed further with reference to FIG. 11.

RAMP_HI 732, RAMP_MID 734, and RAMP_LO 736 have substantially the same frequency, carefully controlled amplitudes, and different common modes. Further, RAMP_MID 734 is 180° out of phase with RAMP_HI 732 and RAMP_LO 736 such that the maxima of RAMP_MID 734 are substantially aligned with the minima of RAMP_HI 732, and the minima of RAMP_MID 734 are substantially aligned with the maxima of RAMP_LO 736. To generate RAMP signals with these characteristics, multi-level ramp generator 730 includes an independent ramp generator for each RAMP signal.

Figure 9:
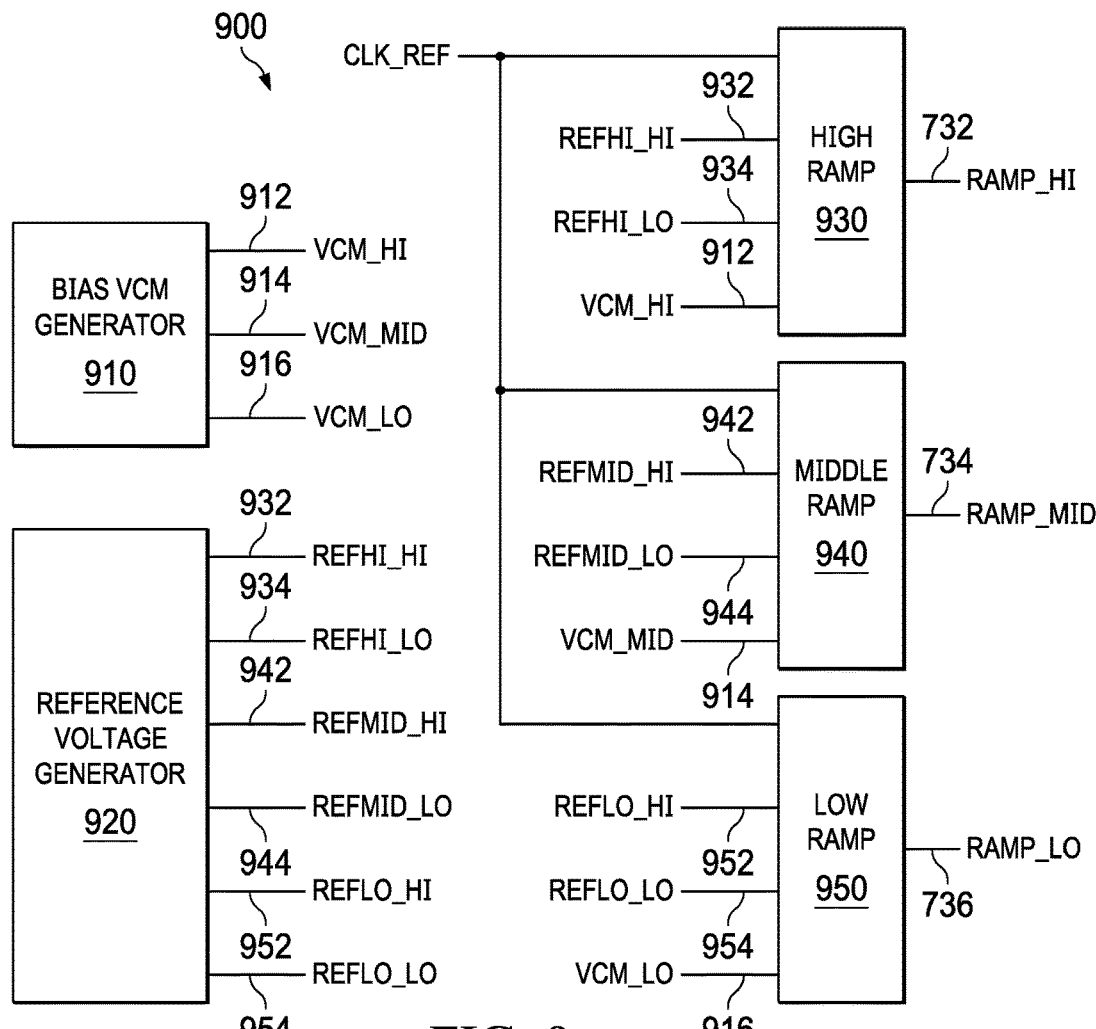
FIG. 9 shows an example multi-level ramp generator.

FIG. 9 shows an example multi-level ramp generator 900 for use in an amplifier, such as amplifier 700 described herein with reference to FIG. 7. Ramp generator 900 includes a bias voltage common mode (VCM) generator 910, a reference voltage generator 920, and three ramp generators: high ramp generator 930, middle ramp generator 940, and low ramp generator 950. As shown in FIG. 8, each ramp has a different common mode level. The bias VCM generator 910 generates a VCM for each ramp generator: VCM_HI 912 for high ramp generator 930, VCM_MID 914 for middle ramp generator 940, and VCM_LO 916 for low ramp generator 950. In some implementations, the bias VCM generator 910 generates a single VCM, such as VCM_MID 914, for all three ramp generators 930, 940, and 950. VCM_HI 912 and VCM_LO 916 are then generated using the peak-to-peak voltages of each ramp and the corresponding voltage difference relative to VCM_MID 914.

Reference voltage generator 920 generates a high voltage reference signal and a low voltage reference signal for each ramp generator to indicate the upper and lower voltages of each ramp, such as voltages V0, V1, V2, and V3 described herein with reference to FIG. 8. Reference voltage generator 920 generates REFHI_HI 932 and REFHI_LO 934 for high ramp generator 930, which in the example of FIG. 8 correspond to V3 and V2. Reference voltage generator 920 generates REFMID_HI 942 and REFMID_LO 944 for middle ramp generator 940, which in the example of FIG. 8 correspond to V2 and V1. Reference voltage generator 920 generates REFLO_HI 952 and REFLO_LO 954 for low ramp generator 950, which in the example of FIG. 8 correspond to V1 and V0. REFHI_LO 934 and REFMID_HI 942 are substantially the same voltage. Similarly, REFMID_LO 944 and REFLO_HI 952 are substantially the same voltage.

Each of high ramp generator 930, middle ramp generator 940, and low ramp generator 950 receive the appropriate VCM signal from bias VCM generator 920, the appropriate high voltage reference signal and low voltage signal from reference voltage generator 930, and the same clock reference signal. From these inputs, high ramp generator 930 generates RAMP_HI 732, middle ramp generator 940 generates RAMP_MID 734, and low ramp generator 950 generates RAMP_LO 736.

Figure 10:
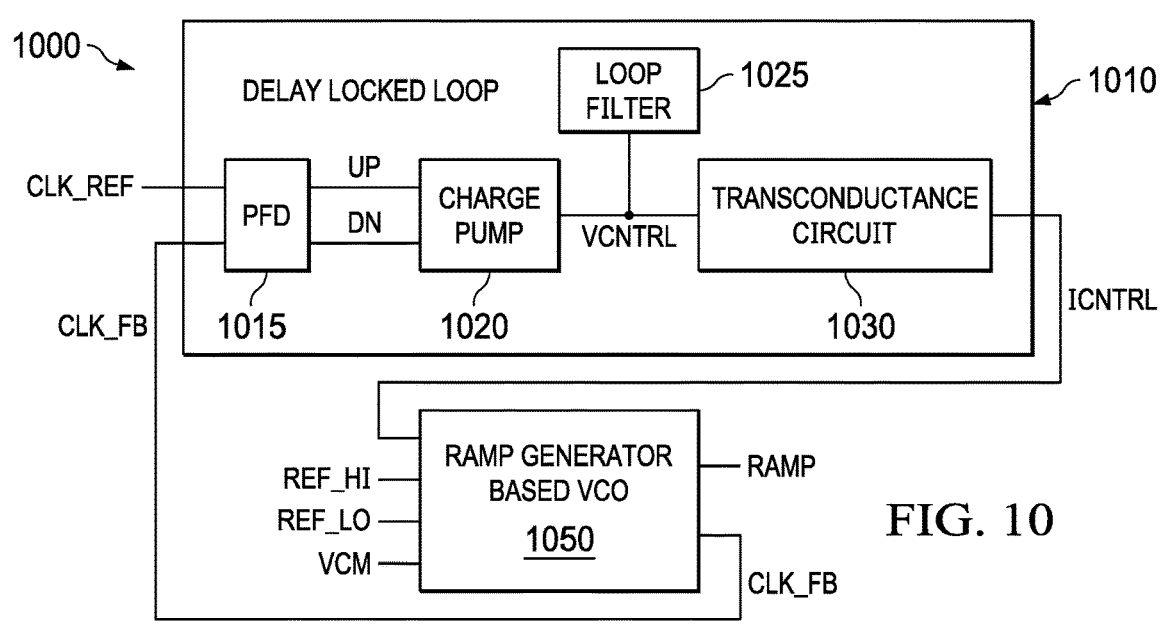
FIG. 10 shows an example ramp generator in an example multi-level ramp generator.

FIG. 10 shows an example ramp generator 1000 in multi-level ramp generator 900. Ramp generator 1000 includes a delay locked loop (DLL) 1010 and a ramp generator based voltage controlled oscillator (VCO) 1050. The DLL 1010 allows multi-level ramp generator 900 to synchronize the frequencies of the generated ramps to a single reference clock, and includes a phase-frequency detector (PFD) 1015, a charge pump 1020, a loop filter 1025, and a transconductance circuit 1030. The PFD 1015 receives the reference clock signal CLK_REF and a clock feedback signal CLK_FB, and outputs signals UP and DN, which are square waves with a pulse width proportional to the phase difference between CLK_REF and CLK_FB. Charge pump 1020 receives UP and DOWN from PFD 1015 and works in conjunction with loop filter 1025 as an integrator to generate a voltage control signal VCtrl. VCtrl is converted to a current control signal ICtrl through transconductance circuit 1030.

Ramp generator based VCO 1050 receives ICtrl, as well as the high reference voltage signal and the low voltage reference signal for the particular ramp generator, such as those generated by reference voltage generator 920. Ramp generator based VCO 1050 outputs the particular ramp signal for the particular ramp generator and the clock feedback signal CLK_FB. For example, ramp generator based VCO 1050 receives VCM_HI 912, REFHI_HI 932, and REFHI_LO 934 and outputs RAMP_HI 732. The ramp generated by ramp generator based VCO 1050 is provided to other components in the amplifier, such as comparison logic 740, while CLK_FB is provided to PFD 1015 in a closed feedback loop.

Figure 11:
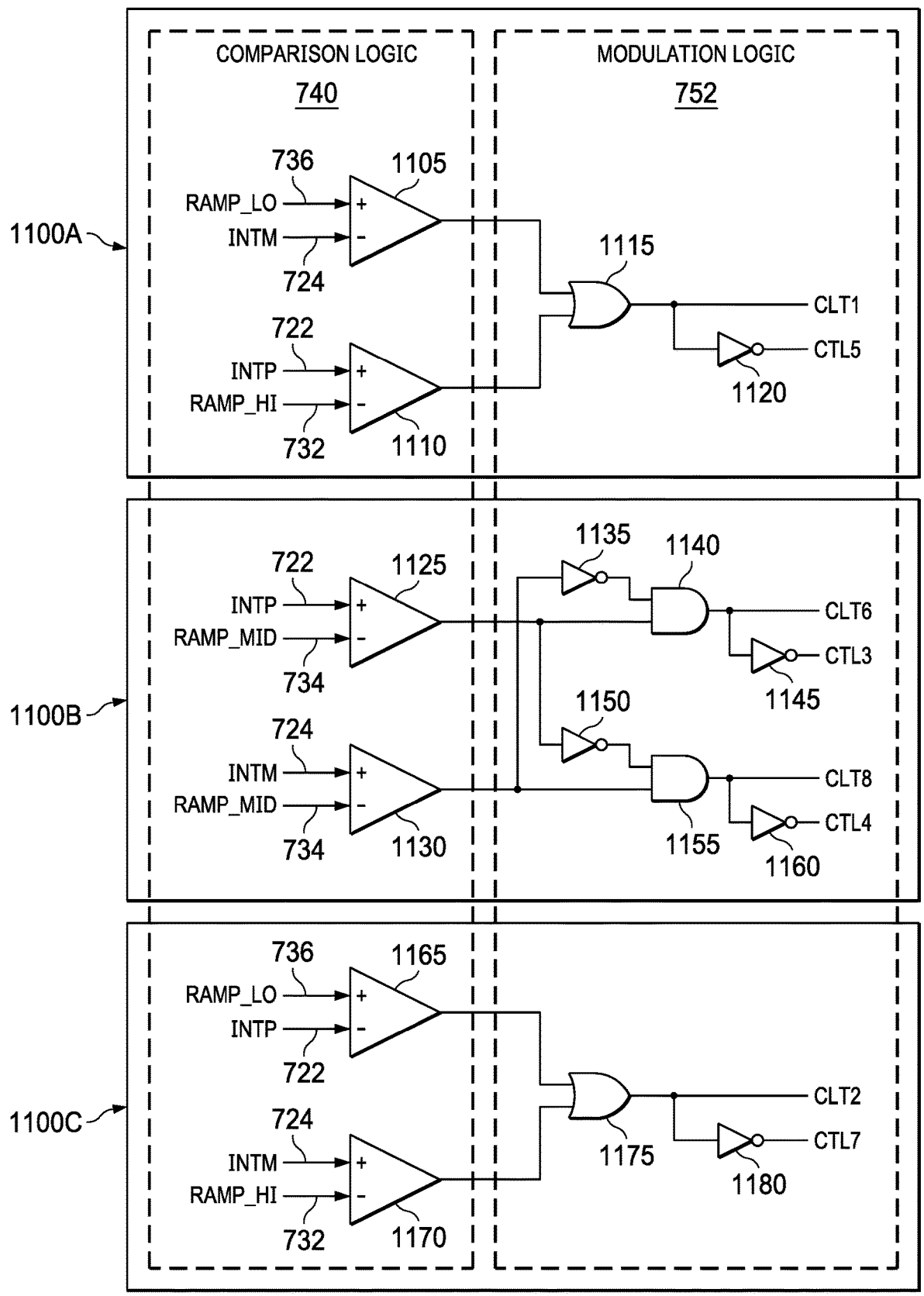
FIG. 11 shows example comparison logic and example modulation logic in the example amplifier of FIG. 7.

FIG. 11 shows an example comparison logic and modulation logic in the example amplifier 700 of FIG. 7. As described above with reference to FIGS. 7 and 8, comparison logic 740 compares INTP 722 and INTM 724 to the ramps RAMP_HI 732, RAMP_MID 734, and RAMP_LO 736 generated by multi-level ramp generator 730. The results of these comparisons are used by controller 750 to determine which mode of operation output stage 400 should be operated in, and to generate appropriate control signals for elements within output stage 400. Analysis blocks 1100A, 1100B, and 1100C illustrate operation of an example comparison logic 740 and modulation logic 752. Analysis block 1100A results in control signals for M1 and M5, analysis block 1100B results in control signals for M3, M4, M6, and M8, and analysis block 1100C results in control signals for M2 and M7.

In analysis block 1100A, comparator 1105 compares RAMP_LO 736 and INTM 724, and outputs a pulse width modulated signal that is logic high in response to RAMP_LO 736 being greater than INTM 724 and logic low in response to RAMP_LO 736 being less than INTM 724. Comparator 1110 compares INTP 722 and RAMP_HI 732, and outputs a pulse width modulated signal that is logic high in response to INTP 722 being greater than RAMP_HI 732 and logic low in response to INTP 722 being less than RAMP_HI 732. OR gate 1115 in modulation logic 752 receives the output signals of comparator 1105 and comparator 1110, and outputs CTL1 for M1 in output stage 400.

As discussed above with reference to FIGS. 4, M1 and M5 cannot be on at the same time, and so CTL1 passes through inverter 1120 to become CTL5 for M5. Thus, analysis block 1100A results in the control signals for M1 and M5. While output stage 400 is in a higher power mode of operation 620, CTL1 and CTL5 cause M1 and M5 to toggle on and off reciprocally, and provide either VLINK or VBATT to OUTP node 130. While output stage 400 is in a lower power mode of operation 610, CTL1 causes M1 to maintain an off state, disconnecting bridge driver 120 and OUTP node 130 from VLINK node 115, and CTL5 causes M5 to maintain an on state.

In analysis block 1100B, comparator 1125 compares INTP 722 and RAMP_MID 734, and outputs a pulse width modulated signal that is logic high in response to INTP 722 being greater than RAMP_MID 734 and logic low in response to INTP 722 being less than RAMP_MID 734. In response to INTP 722 being greater than RAMP_MID 734, output stage 400 operates in a higher power mode. Comparator 1130 compares INTM 724 and RAMP_MID 734, and outputs a pulse width modulated signal that is logic high in response to INTM 724 being greater than RAMP_MID 734 and logic low in response to INTM 724 being less than RAMP_MID 734.

AND gate 1140 in modulation logic 752 receives the output signal of comparator 1125 directly, and the output signal of comparator 1130 after it is inverted by inverter 1135. AND gate 1140 outputs CTL6 for M6 in output stage 400. As discussed above with reference to FIGS. 2, M6 and M3 cannot be on at the same time, and so CTL6 passes through inverter 1140 to become CTL3 for M3. Thus, analysis block 1100B results in the control signals for M3 and M6. While output stage 400 is in a higher power mode of operation 620, CTL3 causes M3 to maintain an off state, disconnecting ground from OUTP node 130, and CTL6 causes M6 to maintain its current state. While output stage 400 is in a lower power mode of operation 610, CTL3 and CTL6 cause M3 and M6 to toggle on and off reciprocally, and provide either ground or VBATT to OUTP node 130.

AND gate 1155 in modulation logic 752 receives the output signal of comparator 1130 directly, and the output signal of comparator 1125 after it is inverted by inverter 1150. AND gate 1155 outputs CTL8 for M8 in output stage 400. As discussed above with reference to FIGS. 2, M8 and M4 cannot be on at the same time, and so CTL8 passes through inverter 1160 to become CTL4 for M4. Thus, analysis block 1100B also results in the control signals for M4 and M8. While output stage 400 is in a higher power mode of operation 620, CTL4 causes M4 to maintain an off state, disconnecting ground from OUTM node 135, and CTL8 causes M8 to maintain an on state. While output stage 400 is in a lower power mode of operation 610, CTL4 and CTL8 cause M4 and M8 to toggle on and off reciprocally, and provide either ground or VBATT to OUTM node 135.

In analysis block 1100C, comparator 1165 compares RAMP_LO 736 and INTP 722, and outputs a pulse width modulated signal that is logic high in response to RAMP_LO 736 being greater than INTP 722 and logic low in response to RAMP_LO 736 being less than INTP 722. Comparator 1170 compares INTM 724 and RAMP_HI 732, and outputs a pulse width modulated signal that is logic high in response to INTM 724 being greater than RAMP_HI 732 and logic low in response to INTM 724 being less than RAMP_HI 732. OR gate 1175 in modulation logic 752 receives the output signals of comparator 1165 and comparator 1170, and outputs CTL2 for M2 in output stage 400.

As discussed above with reference to FIGS. 4, M2 and M7 cannot be on at the same time, and so CTL2 passes through inverter 1180 to become CTL7 for M7. Thus, analysis block 1100C results in the control signals for M2 and M7. While output stage 400 is in a higher power mode of operation 620, CTL2 and CTL7 cause M2 and M7 to toggle on and off reciprocally, and provide either VLINK or VBATT to OUTM node 135. While output stage 400 is in a lower power mode of operation 610, CTL2 causes M2 to maintain an off state, disconnecting bridge driver 120 and OUTM node 135 from VLINK node 115, and CTL7 causes M7 to maintain an on state.

Figure 12:
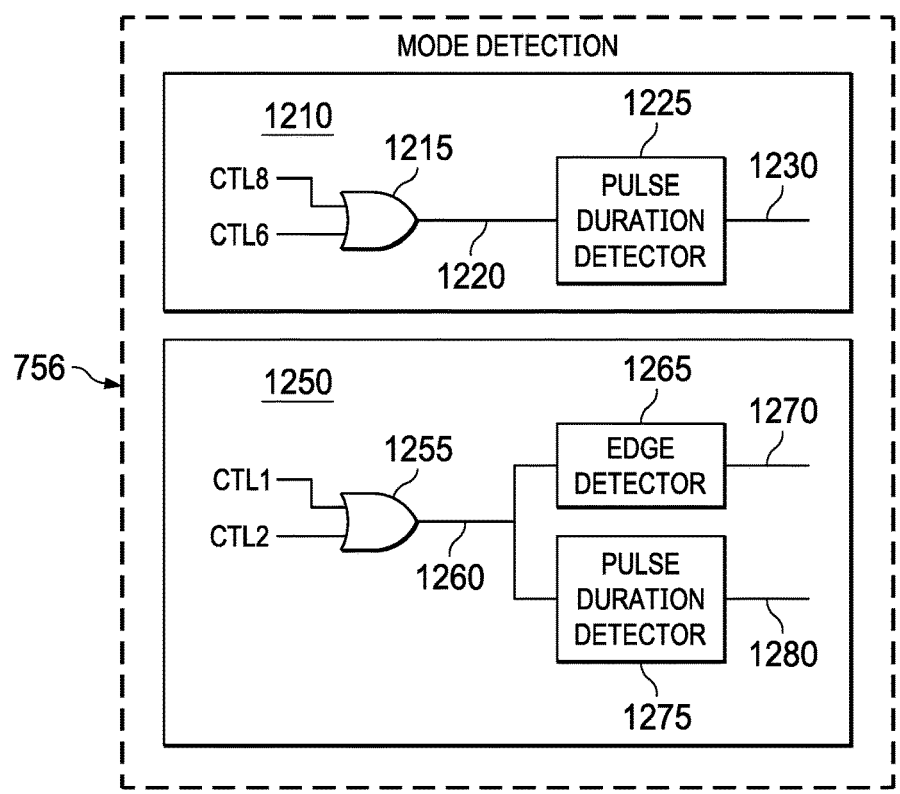
FIG. 12 shows example mode detection logic in the example amplifier of FIG. 7.

FIG. 12 shows an example mode detection logic 756 in the example amplifier 700 of FIG. 7. Analysis block 1210 determines if output stage 400 is operating in a lower power mode 160. Analysis block 1250 determines if output stage 400 is operating in a higher power mode 620, and whether charge pump 410 should operate in a mid-level power mode 630 or in a higher power mode 640.

In analysis block 1210, OR gate 1215 receives CTL6 and CTL8, and outputs an indicator signal 1220 that is logic high in response to CTL6 or CTL8 being a pulse width modulated signal. Indicator signal 1220 is input to a pulse duration detector 1225. Output signal 1230 from pulse duration detector 1225 is logic high in response to indicator signal 1220 including pulse width modulated pulses. This in turn indicates output stage 400 is operating in a lower power mode 610, and VBATT from the battery is sufficient. Charge pump 410 should operate in a mid-level power mode 630 at a lower frequency or in a lower power mode itself, for example at a frequency as low as 47 kHz.

In analysis block 1250, OR gate 1255 receives CTL1 and CTL2, and outputs an indicator signal 1260 that is logic high in response to either M1 or M2 being in an on state and logic low in response to both M1 and M2 being in an off state, disconnecting charge pump 410 from bridge driver 120. Indicator signal 1260 is associated with voltage VLINK, and is input to an edge detector 1265 and a pulse duration detector 1275. The duty cycle of indicator signal 1260 is indicative of how long OUTP node 130 and OUTM node 135 receive VLINK from charge pump 410.

If edge detector 1265 detects a logic high value from indicator signal 1260, but pulse duration detector 1275 determines indicator signal 1260 has a duty cycle less than a certain threshold, then output stage 400 is operating in a higher power mode 620, but the mid-level power mode and corresponding lower frequency of operation for charge pump 410 delivers sufficient power to the load. If the pulse duration detector 1275 determines indicator signal 1260 has a duty cycle greater than a certain threshold, then output stage 400 is operating in a higher power mode 620, and charge pump 410 should operate in a higher power mode 640 at a higher frequency to deliver additional power to the load.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described examples, and other implementations and modifications are possible, within the scope of the claims.

What is claimed is:

1. An amplifier, comprising:
   a first transistor coupled between a first voltage source terminal and a positive output terminal of the amplifier;
   a second transistor coupled between the first voltage source terminal and a negative output terminal of the amplifier;
   a third transistor coupled between the positive output terminal and a ground terminal;
   a fourth transistor coupled between the negative output terminal and the ground terminal;
   a fifth transistor coupled to a second voltage source terminal;
   a sixth transistor coupled between the fifth transistor and the positive output terminal;
   a seventh transistor coupled to the second voltage source terminal;
   an eighth transistor coupled between the seventh transistor and the negative output terminal; and
   a capacitive charge pump coupled between the second voltage source terminal and the first voltage source terminal, the capacitive charge pump configured to convert a second voltage at the second voltage source terminal to a first voltage at the first voltage source terminal, in which the first voltage is greater than the second voltage, and the capacitive charge pump comprises one or more capacitors.

2. The amplifier of claim 1, wherein the capacitive charge pump is configured to operate at a first frequency for a first power mode of operation and a second frequency for a second power mode of operation, and the first frequency is less than the second frequency.

3. The amplifier of claim 2, wherein: the capacitive charge pump is configured to operate at a third frequency for a third power mode of operation; the third frequency is less than the first frequency; and during the third power mode of operation, one or more of the capacitors within the capacitive charge pump maintain the first voltage at the first voltage source terminal.

4. The amplifier of claim 2, further comprising a controller configured to:
   responsive to a control signal indicative of a voltage output signal from the positive and negative output terminals having a duty cycle less than a threshold, generate control signals to operate the capacitive charge pump at the first frequency for the first power mode of operation; and
   responsive to the control signal indicative of the voltage output signal having a duty cycle greater than the threshold, generate control signals to operate the capacitive charge pump at the second frequency for the second power mode of operation.

5. The amplifier of claim 4, wherein the controller is configured to determine the duty cycle of the voltage output signal based on control signals for the first and second transistors.

6. An amplifier, comprising:
   a first transistor coupled between a first voltage source terminal and a positive output terminal of the amplifier;
   a second transistor coupled between the first voltage source terminal and a negative output terminal of the amplifier;
   a third transistor coupled between the positive output terminal and a ground terminal;
   a fourth transistor coupled between the negative output terminal and the ground terminal;
   a fifth transistor coupled to a second voltage source terminal;
   a sixth transistor coupled between the fifth transistor and the positive output terminal;
   a seventh transistor coupled to the second voltage source terminal;
   an eighth transistor coupled between the seventh transistor and the negative output terminal; and
   a controller configured to:
      responsive to two input signals to be amplified being within a first voltage range:
         generate control signals to maintain the first and second transistors in an off state; and
         generate control signals to maintain the fifth and seventh transistors in an on state;
      responsive to a control signal indicative of a first half cycle of the input signals:
         generate a control signal to maintain the fourth transistor in an on state;
         generate a control signal to maintain the eighth transistor in an off state; and
         generate control signals to reciprocally toggle on and off the sixth and third transistors; and
      responsive to a control signal indicative of a second half cycle of the input signals:
         generate a control signal to maintain the third transistor in an on state;
         generate a control signal to maintain the sixth transistor in an off state; and
         generate control signals to reciprocally toggle on and off the eighth and fourth transistors.

7. The amplifier of claim 6, wherein the first half cycle of the input signals corresponds to a positive half cycle of a positive input signal and a negative half cycle of a negative input signal.

8. The amplifier of claim 6, wherein the second half cycle of the input signals corresponds to a negative half cycle of a positive input signal and a positive half cycle of a negative input signal.

9. The amplifier of claim 6, further comprising:
a first comparator configured to compare a first ramp signal to the input signals;
a second comparator configured to compare a second ramp signal to the input signals, wherein the first and second ramp signals have different peak-to-peak magnitudes and different common mode levels; and
a third comparator configured to compare a third ramp signal to the input signals, wherein the third ramp signal has a different peak-to-peak magnitude and a different common mode level than the first ramp signal and the second ramp signal.

10. An amplifier, comprising:
a first transistor coupled between a first voltage source terminal and a positive output terminal of the amplifier;
a second transistor coupled between the first voltage source terminal and a negative output terminal of the amplifier;
a third transistor coupled between the positive output terminal and a ground terminal;
a fourth transistor coupled between the negative output terminal and the ground terminal;
a fifth transistor coupled to a second voltage source terminal;
a sixth transistor coupled between the fifth transistor and the positive output terminal;
a seventh transistor coupled to the second voltage source terminal;
an eighth transistor coupled between the seventh transistor and the negative output terminal; and
a controller configured to, responsive to two input signals to be amplified being outside a first voltage range and responsive to a control signal indicative of a first half cycle of the input signals:
generate control signals to maintain the second, third and eighth transistors in an off state;
generate control signals to maintain the fourth, sixth and seventh transistors in an on state; and
generate control signals to reciprocally toggle on and off the first and fifth transistors.

11. The amplifier of claim 10, wherein the first half cycle of the input signals corresponds to a positive half cycle of a positive input signal and a negative half cycle of a negative input signal.

12. The amplifier of claim 10, further comprising:
a first comparator configured to compare a first ramp signal to the input signals;
a second comparator configured to compare a second ramp signal to the input signals, wherein the first and second ramp signals have different peak-to-peak magnitudes and different common mode levels; and
a third comparator configured to compare a third ramp signal to the input signals, wherein the third ramp signal has a different peak-to-peak magnitude and a different common mode level than the first ramp signal and the second ramp signal.

13. An amplifier, comprising:
a first transistor coupled between a first voltage source terminal and a positive output terminal of the amplifier;
a second transistor coupled between the first voltage source terminal and a negative output terminal of the amplifier;
a third transistor coupled between the positive output terminal and a ground terminal;
a fourth transistor coupled between the negative output terminal and the ground terminal;
a fifth transistor coupled to a second voltage source terminal;
a sixth transistor coupled between the fifth transistor and the positive output terminal;
a seventh transistor coupled to the second voltage source terminal;
an eighth transistor coupled between the seventh transistor and the negative output terminal; and
a controller configured to, responsive to two input signals to be amplified being outside a first voltage range and responsive to a control signal indicative of a second half cycle of the input signals:
generate control signals to maintain the third, fifth, and eighth transistors in an on state;
generate control signals to maintain the first, fourth, and sixth transistors in an off state; and
generate control signals to reciprocally toggle on and off the second and seventh transistors.

14. The amplifier of claim 13, wherein the second half cycle of the input signals corresponds to a negative half cycle of a positive input signal and a positive half cycle of a negative input signal.

15. The amplifier of claim 13, further comprising:
a first comparator configured to compare a first ramp signal to the input signals;
a second comparator configured to compare a second ramp signal to the input signals, wherein the first and second ramp signals have different peak-to-peak magnitudes and different common mode levels; and
a third comparator configured to compare a third ramp signal to the input signals, wherein the third ramp signal has a different peak-to-peak magnitude and a different common mode level than the first ramp signal and the second ramp signal.

16. An amplifier, comprising:
a first transistor coupled between a first voltage terminal and a positive output terminal of the amplifier;
a second transistor coupled between the first voltage terminal and a negative output terminal of the amplifier;
a first switch network configured to switch a common voltage to the positive and negative output terminals;
a second switch network configured to switch a second voltage at a second voltage source terminal to the positive and negative output terminals;
a capacitive charge pump configured to convert the second voltage at the second voltage source terminal to a first voltage at the first voltage terminal, wherein the first voltage is greater than the second voltage; and
a controller configured to:
responsive to a control signal indicative of an input signal to be amplified being lower than a threshold, turn off the first and second transistors and reciprocally turn on and off the first and second switch networks; and
responsive to the control signal indicative of the input signal being greater than the threshold, turn off the first switch network, reciprocally turn on and off the first and second transistors, and reciprocally turn on and off the second switch network.

17. The amplifier of claim 16, wherein the threshold is a first threshold, and the controller is configured to:
responsive to a control signal indicative of an output voltage signal of the amplifier having a duty cycle less than a second threshold, operate the capacitive charge pump at a first frequency; and responsive to the control signal indicative of the output voltage signal of the amplifier having a duty cycle greater than the second threshold, operate the capacitive charge pump at a second frequency, wherein the second frequency is greater than the first frequency.

18. The amplifier of claim 16, further comprising a mode detection circuit configured to determine a duty cycle of an output voltage signal of the amplifier and generate the control signals provided to the controller.

19. The amplifier of claim 16, further comprising a comparison logic circuit configured to compare ramp signals to the input signal and generate the control signals provided to the controller.

20. An amplifier, comprising:
- a capacitive charge pump configured to convert a first voltage at on a first voltage source terminal to a second voltage at a second voltage terminal, wherein the second voltage is greater than the first voltage;
- a first switch network coupled to the second voltage terminal and configured to switch the second voltage at the second voltage terminal to an output terminal;
- a second switch network coupled to the first voltage source terminal and configured to switch the first voltage at the first voltage source terminal to the output terminal;
- a third switch network configured to switch a common voltage to the output terminal; and
- a controller configured to:
  - responsive to a control signal indicative of an input signal to be amplified being lower than a threshold, provide control signals to the second switch network and the third switch network to reciprocally toggle an output voltage at the output terminal between the first voltage at the first voltage source terminal and the common voltage; and
  - responsive to the control signal indicative of the input signal being greater than the threshold, provide control signals to the first switch network and the second switch network to reciprocally toggle an output voltage at the output terminal between the second voltage at the second voltage terminal and the first voltage at the first voltage source terminal.

21. The amplifier of claim 20, wherein the threshold is a first threshold, and the controller is configured to:
- responsive to a control signal indicative of an output voltage signal from the output terminal having a duty cycle less than a second threshold, provide control signals to operate the capacitive charge pump at a first frequency; and
- responsive to the control signal indicative of the output voltage signal from the output terminal having a duty cycle greater than the second threshold, provide control signals to operate the capacitive charge pump at a second frequency, wherein the second frequency is greater than the first frequency.

22. The amplifier of claim 20, wherein the first switch network comprises a first transistor coupled between the second voltage terminal and a positive output terminal of the amplifier and a second transistor coupled between the second voltage terminal and a negative output terminal of the amplifier.

23. The amplifier of claim 20, wherein the second switch network comprises:
- a first transistor coupled to the first voltage source terminal;
- a second transistor coupled to the first transistor and a positive output terminal of the amplifier;
- a third transistor coupled to the first voltage source terminal; and
- a fourth transistor coupled to the third transistor and a negative output terminal of the amplifier.

24. The amplifier of claim 20, wherein the third switch network comprises a first transistor coupled to the common voltage and a positive output terminal of the amplifier and a second transistor coupled to the common voltage and a negative output terminal of the amplifier.

* * * * *